United States Patent
Darshan (10) Patent No.: US 7,355,416 B1
(45) Date of Patent: Apr. 8, 2008

(54) MEASUREMENT OF CABLE QUALITY BY POWER OVER ETHERNET

(75) Inventor: Yair Darshan, Petach Tikva (IL)

(73) Assignee: Microsemi Corp.- Analog Mixed Signal Group Ltd., Hod Hasharon (IL)

( * ) Notice: Subject to any disclaimer, the term of this patent is extended or adjusted under 35 U.S.C. 154(b) by 0 days.

(21) Appl. No.: 11/620,673

(22) Filed: Jan. 7, 2007

(51) Int. Cl.
*G01R 27/08* (2006.01)
*G06F 1/32* (2006.01)

(52) U.S. Cl. ............. 324/713; 713/340; 713/322

(58) Field of Classification Search ........... 324/713; 340/538
See application file for complete search history.

(56) References Cited

U.S. PATENT DOCUMENTS

| | | | |
|---|---|---|---|
| 4,766,386 A * | 8/1988 | Oliver et al. ............. | 324/533 |
| 5,596,637 A * | 1/1997 | Pasetti et al. .......... | 379/399.02 |
| 6,473,608 B1 | 10/2002 | Lehr et al. | |
| 6,643,566 B1 | 11/2003 | Lehr et al. | |
| 6,820,225 B1 * | 11/2004 | Johnson et al. ............. | 714/715 |
| 7,116,778 B2 * | 10/2006 | Eckhoff et al. ........ | 379/399.01 |
| 7,145,439 B2 | 12/2006 | Darshan et al. | |
| 7,245,129 B2 * | 7/2007 | Wajcer et al. .............. | 324/533 |
| 7,257,724 B2 * | 8/2007 | Lehr et al. ................. | 713/323 |
| 2004/0158167 A1 * | 8/2004 | Smith et al. ............... | 600/547 |
| 2006/0165110 A1 * | 7/2006 | Magendanz et al. ........ | 370/419 |
| 2006/0176044 A1 * | 8/2006 | Binder et al. .............. | 324/71.1 |
| 2007/0064819 A1 | 3/2007 | Langer | |
| 2007/0223164 A1 * | 9/2007 | Oki et al. .................... | 361/94 |

FOREIGN PATENT DOCUMENTS

EP    1764947 A2 *   3/2007

OTHER PUBLICATIONS

IEEE Standards—802.3af-2003, pp. 36-57 (sections 33.2.3.7-33.3.6.1), p. 94-96; p. 102, p. 115, published Jun. 18, 2003, New York.

* cited by examiner

*Primary Examiner*—Walter Benson
*Assistant Examiner*—Benjamin M Baldridge
(74) *Attorney, Agent, or Firm*—Simon Kahn (57) ABSTRACT

A method of determining impedance comprising: supplying power to a powered device from a power sourcing equipment at a first current limited level, $I_{lim1}$; measuring, at a plurality of times a voltage associated with the output of the power sourcing equipment; determining a minimum voltage, $V_{min1}$, of the measured plurality of voltages; determining an associated time of the determined $V_{min1}$; removing the supplied power from the powered device; subsequent to the removing, supplying power to the powered device from the power sourcing equipment at a second current limited level, $I_{lim2}$, the $I_{lim2}$ being different than the $I_{lim1}$; measuring, at the determined associated time in relation to the beginning of the supplying power at the $I_{lim2}$, a voltage associated with the output of the power sourcing equipment, $V_{min2}$; and determining an impedance responsive to the $V_{min1}$, $V_{min2}$, $I_{lim1}$ and $I_{lim2}$.

20 Claims, 7 Drawing Sheets

MEASUREMENT OF CABLE QUALITY BY POWER OVER ETHERNET

BACKGROUND OF THE INVENTION

The invention relates generally to the field of power over local area networks, particularly Ethernet based networks, and more particularly to a method of measuring cable impedance via the use of power over Ethernet.

The growth of local and wide area networks based on Ethernet technology has been an important driver for cabling offices and homes with structured cabling systems having multiple twisted wire pairs. The structured cable is also known herein as communication cabling and typically comprises four twisted wire pairs. In certain networks only two twisted wire pairs are used for communication, with the other set of two twisted wire pairs being known as spare pairs. In other networks all four twisted wire pairs are used for communication. The ubiquitous local area network, and the equipment which operates thereon, has led to a situation where there is often a need to attach a network operated device for which power is to be advantageously supplied by the network over the network wiring. Supplying power over the network wiring has many advantages including, but not limited to; reduced cost of installation; centralized power and power back-up; and centralized security and management.

Several patents addressed to the issue of supplying power to a PD over an Ethernet based network exist including: U.S. Pat. No. 6,473,608 issued Oct. 29, 2002 to Lehr et al.; and U.S. Pat. No. 6,643,566 issued Nov. 3, 2003 to Lehr et al.; the contents of all of which are incorporated herein by reference.

The IEEE 802.3af-2003 standard, whose contents are incorporated herein by reference, is addressed to powering remote devices over an Ethernet based network. The above standard is limited to a powered device (PD) having a maximum power requirement during operation of 12.95 watts. Power can be delivered to the PD either directly from the switch/hub known as an endpoint power sourcing equipment (PSE) or alternatively via a midspan PSE. In either case power is delivered over a set of two twisted pairs. The above mentioned standard further prescribes a method of classification having a total of 5 power levels of which classes 0, 3 and 4 result in a maximum power level of 15.4 Watts at the PSE which is equivalent, in the worst case, to the aforementioned 12.95 watt limit.

The actual difference between the power level drawn from the PSE and the power level received at the PD is primarily a function of the power lost in the cable. The power required at the PSE to support a particular requested maximum power at the PD is thus equal to the requested maximum PD power plus any losses due to the impedance between the PSE and the PD. A maximum cable length of 100 meters is specified, and the voltage supplied by the PSE may range from a minimum of 44 volts to a maximum of 57 volts as measured at the PSE output. Thus, the amount of power lost in the cable may vary significantly depending on actual cable length and actual voltage.

The total amount of power available in a system supporting a plurality of PDs is often limited to less than 15.4 watts times the number of PDs attached. Thus, it is important to manage the power allocated to each PD so that the total power drawn does not exceed the power available from the power supply. In the event power is allocated according to classification, a measure of the impedance between the PD and the PSE, which is a metric of the power loss in the cable, would thus give a more accurate allocation of power per PSE port, since the power lost in each cable would be determined and not reserved for a worst case scenario. Thus, in the event of a determined impedance lower than the worst case scenario, a PD exhibiting a maximum power requirement of 12.95 watts may be supported with an allocation of less than 15.4 watts from a common power supply.

A PSE according to the above mentioned specification exhibits certain characteristics including a maximum current during startup mode. A PD according to the above mentioned specification exhibits certain characteristics including a detection resistance, optional classification current, polarity independence, minimum input capacitance, and a minimum turn on voltage. In the event of a PD input capacitance being greater than or equal to 180 µF, the PD is further required to control the inrush current during startup mode so as to ensure a maximum $I_{inrush}$ of 400 mA. After detection and optional classification, the PD is not to close an isolating switch placing the input capacitance and load across the PSE until a minimum turn on voltage is detected.

There is thus a long felt need for a method of determining the impedance between the PSE and the PD, the impedance being primarily a function of cable quality and cable length.

SUMMARY OF THE INVENTION

Accordingly, it is a principal object of the present invention to overcome the disadvantages of prior art by providing a method of, and an apparatus for, determining the impedance between the PSE and the PD, the method involving a first start-up of the PD and a second start-up of the PD. Power is provided during the first start-up of the PD, the power being current limited to a first current value. A plurality of voltage measurements at the output of the PSE are accomplished during the start-up phase of the PD, and a minimum voltage measurement, with the associated time from start-up of the minimum voltage measurement is determined. During the second start-up of the PD, power is provided with current limited to a second current value different form the first current value. A voltage measurement at the output of the PSE corresponding in time to the minimum measurement of the first start up is accomplished. The cable impedance is determined as the difference between the voltage measurements divided by the difference between the current values.

Advantageously, determining the actual impedance of the cable and connections between the PSE and the PD allows for better allocation of power, since the actual power required to be allocated to the PSE in order to supply the PD classification power is more accurately determined.

The invention provides for a method of determining impedance between a power sourcing equipment and a powered device, the method comprising: supplying power to the powered device from the power sourcing equipment over a communication cabling at a first current limited level, $I_{lim1}$; measuring, at a plurality of times in relation to the beginning of the supplying power, a voltage associated with the output of the power sourcing equipment; determining a minimum voltage, $V_{min1}$, of the measured plurality of voltages; determining an associated time of the determined $V_{min1}$ in relation to the beginning of the supplying power at the $I_{lim1}$; removing, subsequent to the supplying power at the $I_{lim1}$, the supplied power from the powered device; subsequent to the removing, supplying power to the powered device from the power sourcing equipment over the communication cabling at a second current limited level, $I_{lim2}$, the $I_{lim2}$ being different than the $I_{lim1}$; measuring, at the determined associated time in relation to the beginning of the supplying power at the $I_{lim2}$, a voltage associated with the output of the power sourcing equipment, $V_{min2}$; and determining an impedance responsive to the $V_{min1}$, $V_{min2}$, $I_{lim1}$ and $I_{lim2}$.

In one embodiment the determining an impedance comprises: calculating the impedance as the result of $(V_{min1}-V_{min2})/(I_{lim1}-I_{lim2})$. In another embodiment the method further comprises: providing a variable current limiter operative to provide the $I_{lim1}$ and the $I_{lim2}$.

In one embodiment, the method further comprises: further comprising detecting a powered device over the communication cabling, the detecting being prior to the supplying power to the powered device at the $I_{lim1}$. In another embodiment the method further comprises classifying the detected powered device over the communication cabling, the classifying being prior to the supplying power to the powered device at the $I_{lim1}$.

In one embodiment the method further comprises: allocating power to the powered device responsive to the calculated impedance. In another embodiment the method further comprises: allocating power to the powered device, the allocating power being a function of a power requested by the powered device less power lost in the communication cabling, the power lost in the communication cabling being calculated responsive to the calculated impedance. Preferably, the method further comprises classifying the detected powered device over the communication cabling, wherein the power requested is a function of the classifying.

In one embodiment the plurality of times are within a predetermined time from the beginning of the supplying power at the $I_{lim1}$. Preferably, the predetermined time is up to 30 milliseconds. In another embodiment measuring at a plurality of times begins after a transient phase period.

The invention also provides for a power sourcing equipment operable to determine an impedance between the power sourcing equipment and a powered device, the power sourcing equipment comprising: a voltage measuring means; a control circuitry responsive to the voltage measuring means; and at least one current limiter responsive to the control circuitry, the control circuitry being operable to: supply power to a powered device over a communication cabling at a first current limited level, $I_{lim1}$, the $I_{lim1}$ being responsive to the at least one current limiter; measure, via the voltage measuring means, at a plurality of times in relation to the beginning of the power being supplied at the $I_{lim1}$, a voltage associated with the output of the power sourcing equipment; determine a minimum voltage, $V_{min1}$, of the measured plurality of voltages; determine an associated time of the determined $V_{min1}$, in relation to the beginning of the power being supplied at the $I_{lim1}$; remove, subsequent to the power being supplied at the $I_{lim1}$, the supplied power from the powered device; subsequent to the removal of power, supply power to the powered device over the communication cabling at a second current limited level, $I_{lim2}$, the $I_{lim2}$ being different than the $I_{lim1}$, the $I_{lim2}$ being responsive to the at least one current limiter; measure, via the voltage measuring means, at the determined associated time in relation to the beginning of the power being supplied at the $I_{lim2}$, a voltage associated with the output of the power sourcing equipment, $V_{min2}$; and determine an impedance responsive to the $V_{min1}$, $V_{min2}$, $I_{lim1}$ and $I_{lim2}$.

In one embodiment the impedance is determined by the control circuitry being operable to calculate the impedance as the result of $(V_{min1}-V_{min2})/(I_{lim1}-I_{lim2})$.

In another embodiment the at least one current limiter comprises a variable current limiter operable to provide the $I_{lim1}$ and the $I_{lim2}$.

In one embodiment the power sourcing equipment further comprises a detection functionality responsive to the control circuitry, the detection functionality being operable to detect the powered device prior to the power being supplied to the powered device at the $I_{lim1}$. In another embodiment the power sourcing equipment further comprises a classification functionality responsive to the control circuitry, the classification functionality being operable to classify the powered device according to power demand.

In one embodiment the control circuitry is further operable to allocate power to the powered device responsive to the determined impedance. In another embodiment the control circuitry is further operable to allocated power to the powered device, the allocation of power being a function of a power requested by the powered device less power lost in the communication cabling, the power lost in the communication cabling being calculated responsive to the determined impedance. Preferably, the power sourcing equipment further comprises a classifying functionality operable to classify the powered device according to power demand, wherein the power requested is a function of the classification.

In one embodiment the plurality of times are within a predetermined time from the beginning of the power being supplied at the $I_{lim1}$. Preferably, the predetermined time is up to 30 milliseconds. In another embodiment the measuring at a plurality of times begins after a transient phase period.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding sections or elements throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

The present embodiments enable a method of, and an apparatus for, determining the impedance between the PSE and the PD, the method involving a first start-up of the PD and a second start-up of the PD. Power is provided during the first start-up of the PD, the power being current limited to a first current value. A plurality of voltage measurements at the output of the PSE are accomplished during the start-up phase of the PD, and a minimum voltage measurement, with the associated time from start-up of the minimum voltage measurement is determined. During the second start-up of the PD, power is provided with current limited to a second current value different form the first current value. A voltage measurement at the output of the PSE corresponding in time to the minimum measurement of the first start up is accomplished. The cable impedance is determined as the difference between the voltage measurements divided by the difference between the current values.

Advantageously, determining the actual impedance of the cable and connections between the PSE and the PD allows for better allocation of power, since the actual power required to be allocated to the PSE in order to supply the PD classification power is more accurately determined.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

The invention is being described as an Ethernet based network, with a powered device being connected thereto. It is to be understood that the powered device is preferably an IEEE 802.3 compliant device preferably employing a 10Base-T, 100Base-T or 1000Base-T connection.

Figure 1A:
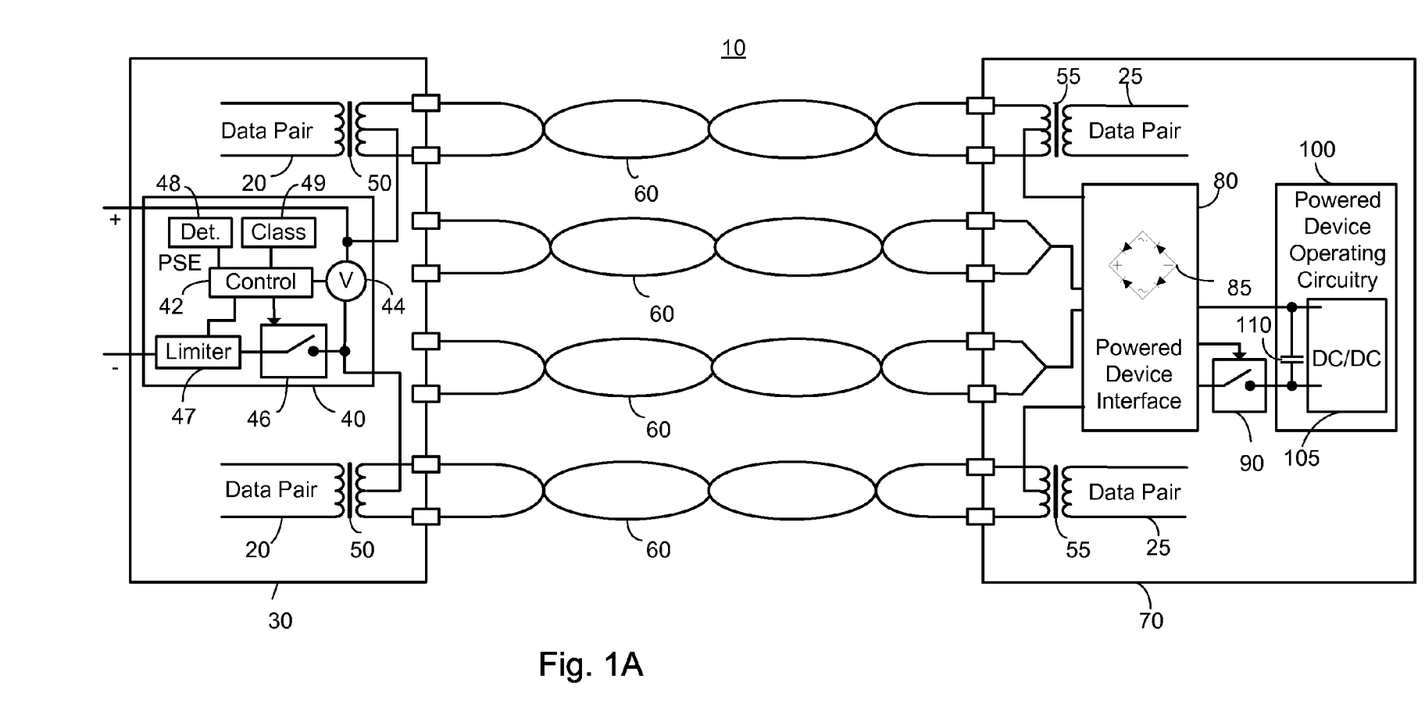
FIG. 1A illustrates a high level block diagram of a first alternative network configuration for remote powering from an endpoint PSE in accordance with a principle of the current invention.

FIG. 1A illustrates a high level block diagram of a first alternative network configuration 10 for remote powering from an endpoint PSE in accordance with a principle of the current invention. Network configuration 10 comprises: a switch/hub equipment 30 comprising a first and a second data pair 20, a PSE 40 comprising a control circuitry 42, a voltage measuring means 44, an electronically controlled switch 46, a variable current limiter 47, a detection functionality 48 and a classification functionality 49, and a first and a second data transformer 50; a first, a second, a third and a fourth twisted pair connection 60; and a powered end station 70 comprising a PD interface 80 exhibiting a pair of diode bridges 85, a first and a second data transformer 55, a first and a second data pair 25, an isolating switch 90, and a PD operating circuitry 100 comprising a DC/DC converter 105 and an input capacitor 110. Powered end station 70 is alternatively denoted PD 70.

A positive power source lead is connected to a first input of voltage measuring means 44 and the center tap of the secondary of first data transformer 50. A negative power source lead is connected to a first end of variable current limiter 47, and a second end of variable current limiter 47 is connected to a first port of electronically controlled switch 46. A second port of electronically controlled switch 46 is connected to a return input of voltage measuring means 44 and the center tap of the secondary of second data transformer 50. A first output of control circuitry 42 is connected to the control port of electronically controlled switch 46, a second output of control circuitry 42 is connected to the control input of variable current limiter 47, and the output of voltage measuring means 44 is connected to an input of control circuitry 42. Each of detection functionality 48 and classification functionality 49 are in communication with control circuitry 42. The primary of first and second data transformers 50 are each connected to communication devices, represented by first and second data pairs 20. The output leads of the secondary of first and second data transformers 50 are each connected to a first end of first and second twisted pair connections 60, respectively. The second end of first and second twisted pair connections 60 are respectively connected to the primary of first and second data transformers 55 located within PD 70. The center tap of the primary of first and second data transformer 55 are connected respectively to the power input and return of PD interface 80. In a preferred embodiment first and second data transformers 55 are part of PD interface 80. PD interface 80 comprises diode bridges 85 arranged to ensure proper operation of PD 70 irrespective of the polarity of the connection to PSE 40. The output of PD interface 80 is connected via isolating switch 90 controlled by PD interface 80 to PD operating circuitry 100. The input to PD operating circuitry 100 is connected to DC/DC converter 105 and appears across capacitor 110, also known as the input capacitor. The secondary of first and second data transformers 55 are connected to communication devices, represented by first and second data pairs 25, respectively.

Variable current limiter 47 and electronically controlled switch 46 are illustrated as separate elements, however this is not meant to be limiting in any way. In an exemplary embodiment variable current limiter 47 and electronically controlled switch are implemented as a single FET and comparator circuit as described in U.S. Pat. No. 6,473,608 to Lehr et al incorporated by reference above.

In operation, control circuitry 42 of PSE 40 detects PD 70 via detection functionality 48, optionally classifies PD 70 via classification functionality 49, and if power is available, supplies power over first and second twisted pair connection 60 to PD 70, by closing electronically controlled switch 46 thus supplying both power and data over first and second twisted pair connections 60. Third and fourth twisted pair connections 60 are not utilized, and are thus available as spare connections. Third and fourth twisted pair connections 60 are shown connected to PD interface 80 in order to allow operation alternatively in a manner that will be described further hereinto below in relation to FIG. 1B over unused third and fourth twisted pair connections 60.

PD interface 80 functions to present a signature resistance (not shown) to PSE 40 thus enabling detection by detection functionality 48, optionally present a classification current in cooperation with classification functionality 49, and upon detection of a sufficient operating voltage, denoted as $V_{on}$, irrespective of polarity, to close isolating switch 90 thereby powering PD operating circuitry 100. DC/DC converter 105 is operable to convert the power received from PD interface 80 to an appropriate voltage to power PD operating circuitry 100 and exhibits capacitor 110 across its input. Thus, upon the closing of isolating switch 90, capacitor 110 is presented as an input capacitor to PSE 40 through diode bridges 85, first and second data transformers 55 and first and second twisted pair connections 60. PD interface 80 is further operable to monitor the voltage presented from PSE 40, and in the event that the monitored voltage is below a predetermined turn off voltage, denoted $V_{off}$, to open isolating switch 90. In an exemplary embodiment, $V_{on}$ is a maximum of 42 volts, and $V_{off}$ is a minimum of 30 volts.

Control circuitry 42 is further operable prior to closing electronically controlled switch to set variable current limiter 47 to a first value, denoted $I_{lim1}$, and to measure the port voltage via voltage measuring means 44 periodically during the start up phase while further marking the time of measurement in relation to the closing of electronically controlled switch 46. In a preferred embodiment a voltage measurement is taken every 2 μseconds after closing electronically controlled switch 46 until the end of the start up period, typically 30 milliseconds after closing electronically controlled switch 46. Preferably, voltage measurements begin after the end of a transient phase lasting up to 2 milliseconds. Control circuitry 42 is further operable to determine the minimum voltage point from among the periodic measurements, denoted $V_{min1}$, and to store $V_{min1}$ and associated time from closing electronically controlled switch 46, denoted $t_{min}$.

At a successive start up, i.e. after control circuitry 42 has shut down power to PD operating circuitry 100, control circuitry 42 is further operable prior to closing electronically controlled switch to set variable current limiter 47 to a second value, denoted $I_{lim2}$, different than the $I_{lim1}$, and to measure the port voltage via voltage measuring means 44 at the time $t_{min}$ from closing electronically controlled switch 46. Control circuitry 42 further calculates the cable impedance as the difference between the stored voltage measurement and the voltage measurement at the successive start up divided by the difference between the first value and the second value, in particular:

$$Z_{cable} = (V_{min1} - V_{min2})/(I_{lim1} - I_{lim2}) \quad \text{Eq. 1}$$

Thus, $t_{min}$ is utilized to ensure that $V_{min1}$ and $V_{min2}$ correspond in the time domain in relation to a startup.

The above has been described in an embodiment in which the cable impedance, or more particularly the impedance between PSE 40 and PD interface 80, is determined at a second startup event, the second startup event occurring at a time in the future from the first startup event, however this is not meant to be limiting in any way. In one embodiment, PDs are initially powered, have power removed for a sufficient time to ensure discharge of capacitor 110, and are subsequently automatically powered after detection and optional classification, the second powering accomplishing determination of the cable impedance in accordance with Eq. 1.

In one embodiment $I_{lim1}$ and $I_{lim2}$ each meet the requirements for $I_{inrush}$, i.e. both $I_{lim1}$ and $I_{lim2}$ are between 400 mA and 450 mA.

Figure 1B:
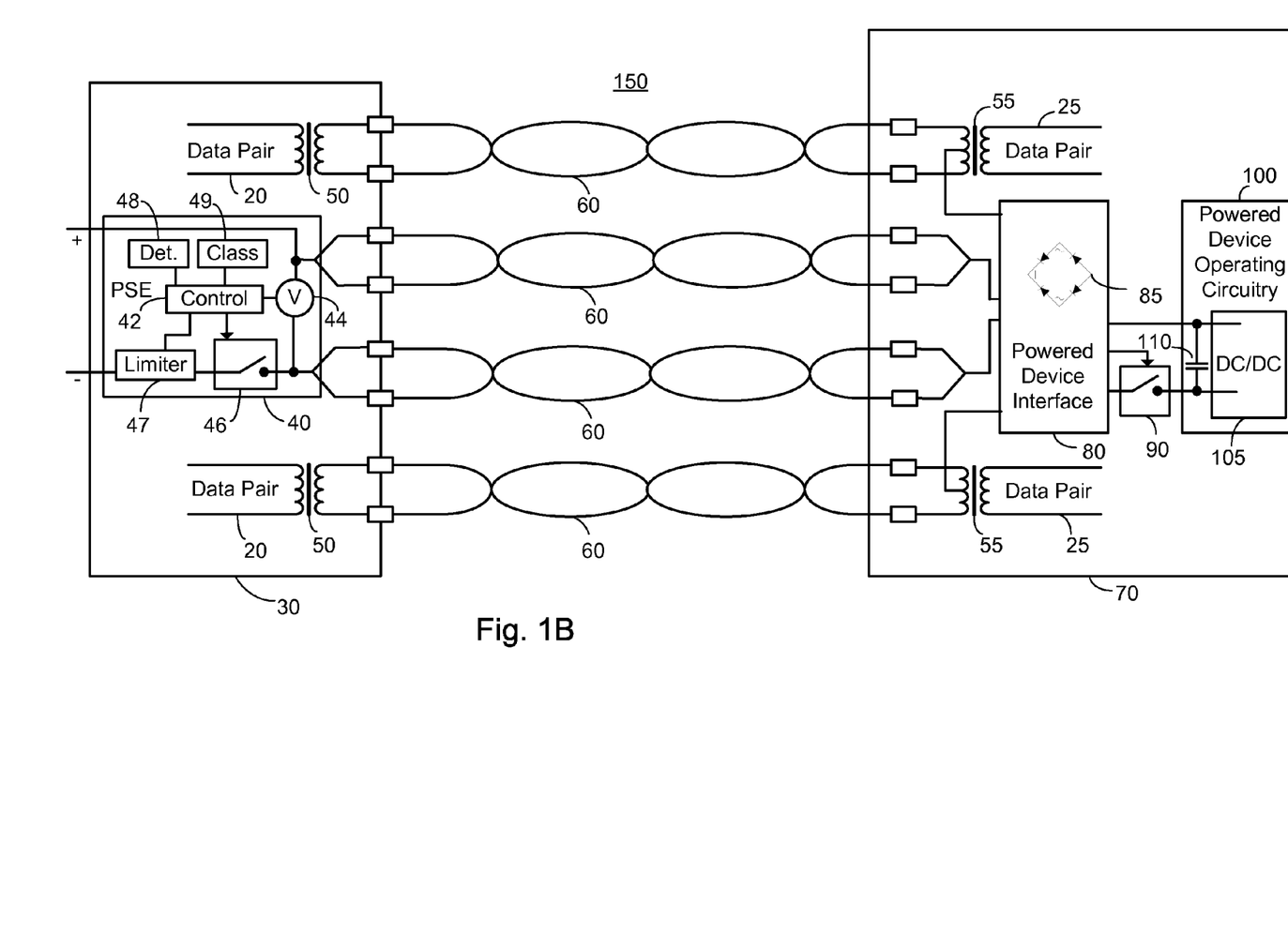
FIG. 1B illustrates a high level block diagram of a second alternative network configuration for remote powering from an endpoint PSE in accordance with a principle of the current invention.

FIG. 1B illustrates a high level block diagram of a second alternative network configuration 150 for remote powering from an endpoint PSE in accordance with a principle of the current invention. Network configuration 150 comprises: a switch/hub equipment 30 comprising a first and a second data pair 20, a PSE 40 comprising a control circuitry 42, a voltage measuring means 44, an electronically controlled switch 46, a variable current limiter 47, a detection functionality 48 and a classification functionality 49, and a first and a second data transformer 50; a first, a second, a third and a fourth twisted pair connection 60; and a powered end station 70 comprising a PD interface 80 exhibiting a pair of diode bridges 85, a first and a second data transformer 55, a first and a second data pair 25, an isolating switch 90, and a PD operating circuitry 100 comprising a DC/DC converter 105 and an input capacitor 110. Powered end station 70 is alternatively denoted PD 70.

A positive power source lead is connected to a first input of voltage measuring means 44 and to both leads of a first end of third twisted pair connection 60. A negative power source lead is connected to a first end of variable current limiter 47, and a second end of variable current limiter 47 is connected to a first port of electronically controlled switch 46. A second port of electronically controlled switch 46 is connected to a return input of voltage measuring means 44 and to both leads of a first end of fourth twisted pair connection 60. A first output of control circuitry 42 is connected to the control port of electronically controlled switch 46, a second output of control circuitry 42 is connected to the control input of variable current limiter 47, and the output of voltage measuring means 44 is connected to an input of control circuitry 42. Each of detection functionality 48 and classification functionality 49 are in communication with control circuitry 42. The primary of first and second data transformers 50 are connected to communication devices, represented by first and second data pairs 20, respectively. The output leads of the secondary of first and second data transformers 50 are each connected to a first end of first and second twisted pair connections 60, respectively. The second end of first and second twisted pair connection 60 is connected to the primary of first and second data transformer 55, respectively, located within PD 70. The center tap of the primary of first and second data transformer 55 is connected to PD interface 80. The second end of third and fourth twisted pair connections 60 are respectively connected to a power input and return of PD interface 80. In a preferred embodiment, first and second data transformers 55 are part of PD interface 80. PD interface 80 comprises diode bridges 85 arrange to ensure proper operation of PD 70 irrespective of the polarity of the connection to PSE 40. The output of PD interface 80 is connected via isolating switch 90 controlled by PD interface 80 to PD operating circuitry 100. The input to PD operating circuitry 100 is connected to DC/DC converter 105 and appears across capacitor 110, also known as the input capacitor. The secondary of first and second data transformers 55 are connected to communication devices, represented by first and second data pairs 25, respectively.

Variable current limiter 47 and electronically controlled switch 46 are illustrated as separate elements, however this is not meant to be limiting in any way. In an exemplary embodiment variable current limiter 47 and electronically controlled switch are implemented as a single FET and comparator circuit as described in U.S. Pat. No. 6,473,608 to Lehr et al incorporated by reference above.

In operation, control circuitry 42 of PSE 40 detects PD 70 via detection functionality 48, optionally classifies PD 70 via classification functionality 49, and if power is available, supplies power over third and fourth twisted pair connections 60 to PD 70, with data being supplied over first and second twisted pair connections 60. Power and data are thus supplied over separate connections, and are not supplied over a single twisted pair connection. The center tap connection of first and second data transformer 55 is not utilized, but is shown connected in order to allow operation alternatively as described above in relation to network configuration 10 of FIG. 1A. Network configurations 10 and 150 thus allow for powering PD 70 by PSE 40 either over the set of twisted pair connections 60 utilized for data communications, or over the set of twisted pair connections 60 not utilized for data communications.

PD interface 80 functions to present a signature resistance (not shown) to PSE 40 thus enabling detection by detection functionality 48, optionally present a classification current in cooperation with classification functionality 49, and upon detection of a sufficient operating voltage, denoted as $V_{on}$, irrespective of polarity, to close isolating switch 90 thereby powering PD operating circuitry 100. DC/DC converter 105 is operable to convert the power received from PD interface 80 to an appropriate voltage to power PD operating circuitry 100 and exhibits capacitor 110 across its input. Thus, upon the closing of isolating switch 90, capacitor 110 is presented as an input capacitor to PSE 40 through diode bridges 85 and third and fourth twisted pair connections 60. PD interface 80 is further operable to monitor the voltage presented from PSE 40, and in the event that the monitored voltage is below a predetermined turn off voltage, denoted $V_{off}$, to open isolating switch 90. In an exemplary embodiment, $V_{on}$ is a maximum of 42 volts, and $V_{off}$ is a minimum of 30 volts.

Control circuitry 42 is further operable prior to closing electronically controlled switch 46 to set variable current limiter 47 to a first value, denoted $I_{lim1}$, and to measure the port voltage via voltage measuring means 44 periodically during the start up phase while further marking the time of measurement in relation to the closing of electronically controlled switch 46. In a preferred embodiment a voltage measurement is taken every 2 µseconds after closing electronically controlled switch 46 until the end of the start up period, typically 30 milliseconds after closing electronically controlled switch 46. Preferably, voltage measurements begin after the end of a transient phase lasting up to 2 milliseconds. Control circuitry 42 is further operable to determine the minimum voltage point from among the periodic measurements, denoted $V_{min1}$, and to store $V_{min1}$ and associated time from closing electronically controlled switch 46, denoted $t_{min}$.

At a successive start up, i.e. after control circuitry 42 has shut down power to PD operating circuitry 100, control circuitry 42 is further operable prior to closing electronically controlled switch to set variable current limiter 47 to a second value, denoted $I_{lim2}$, different than the $I_{lim1}$, and to measure the port voltage via voltage measuring means 44 at the time $t_{min}$ from closing electronically controlled switch 46. Control circuitry 42 further calculates the cable impedance as the difference between the stored voltage measurement and the voltage measurement at the successive start up divided by the difference between the first value and the second value, in particular in accordance with Eq. 1, above. Thus, $t_{min}$ is utilized to ensure that $V_{min1}$ and $V_{min2}$ correspond in the time domain in relation to a startup.

The above has been described in an embodiment in which the cable impedance, or more particularly the impedance between PSE 40 and PD interface 80, is determined at a second startup event, the second startup event occurring at a time in the future from the first startup event, however this is not meant to be limiting in any way. In one embodiment, PDs are initially powered, have power removed for a sufficient time to ensure discharge of capacitor 110, and are subsequently automatically powered after detection and optional classification, the second powering accomplishing determination of the cable impedance in accordance with Eq. 1.

In one embodiment $I_{lim1}$ and $I_{lim2}$ each meet the requirements for $I_{inrush}$, i.e. both $I_{lim1}$ and $I_{lim2}$ are between 400 mA and 450 mA.

Figure 1C:
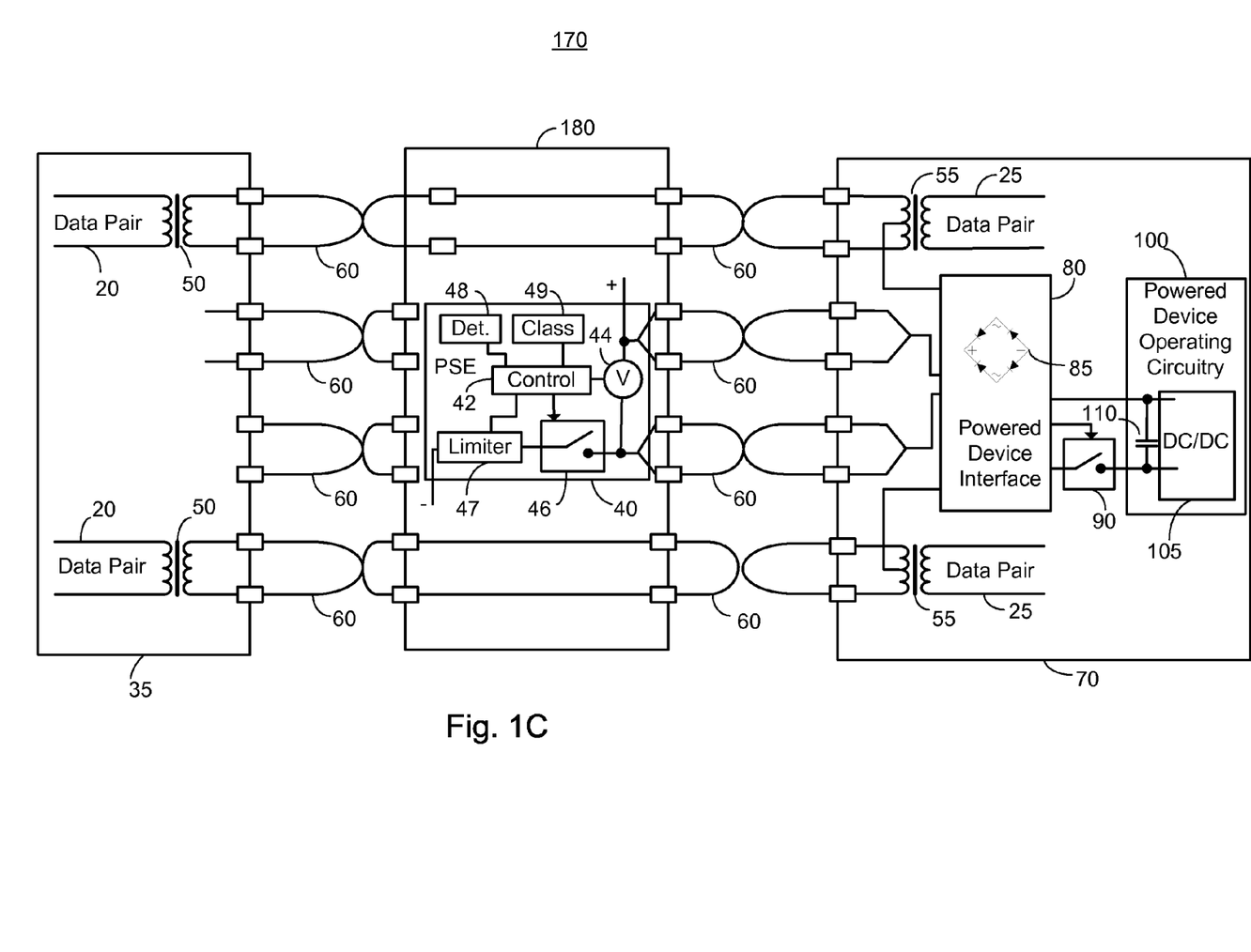
FIG. 1C illustrates a high level block diagram of an alternative network configuration for remote powering from a midspan PSE in accordance with a principle of the current invention.

FIG. 1C illustrates a high level block diagram of an alternative network configuration 170 for remote powering from a midspan power insertion equipment 180 in accordance with a principle of the current invention. Network configuration 170 comprises: a switch/hub equipment 35 comprising a first and a second data pair 20 and a first and a second data transformer 50; a first through eighth twisted pair connection 60; a powered end station 70 comprising a PD interface 80 exhibiting a plurality of diode bridges 85, a first and a second data transformer 55, a first and a second data pair 25, an isolating switch 90, a PD operating circuitry 100 comprising a DC/DC converter 105 and an input capacitor 110; and a midspan power insertion equipment 180 comprising a PSE 40 comprising a control circuitry 42, a voltage measuring means 44, an electronically controlled switch 46, a variable current limiter 47, a detection functionality 48 and a classification functionality 49. Powered end station 70 is alternatively denoted PD 70.

The primary of first and second data transformers 50 are connected, respectively, to communication devices represented by first and second data pairs 20. The output leads of the secondary of first and second data transformers 50 are connected, respectively, to a first end of first and second twisted pair connections 60. The second end of first and second twisted pair connections 60 are connected as a straight through connection through midspan power insertion equipment 180 to a first end of fifth and sixth twisted pair connections 60, respectively. A second end of fifth and sixth twisted pair connections 60 are connected to the primary of first and second data transformer 55, respectively, located within PD 70. Third and fourth twisted pair connections 60 are shown connected between switch/hub 35 and midspan power insertion equipment 180, however no internal connection to either third of fourth twisted pair connection is made.

A positive power source lead is connected to a first input of voltage measuring means 44 and to both leads of a first end of seventh twisted pair connection 60. A negative power source lead is connected to a first end of variable current limiter 47, and a second end of variable current limiter 47 is connected to a first port of electronically controlled switch 46. A second port of electronically controlled switch 46 is connected to a return input of voltage measuring means 44 and to both leads of a first end of eighth twisted pair connection 60. A first output of control circuitry 42 is connected to the control port of electronically controlled switch 46, a second output of control circuitry 42 is connected to the control input of variable current limiter 47, and the output of voltage measuring means 44 is connected to an input of control circuitry 42. Each of detection functionality 48 and classification functionality 49 are in communication with control circuitry 42. The second end of both leads of seventh and eighth twisted pair connections 60 are respectively connected to a power input and return of PD interface 80. PD interface 80 comprises diode bridges 85 arrange to ensure proper operation of PD 70 irrespective of the polarity of the connection to PSE 40. The output of PD interface 80 is connected via isolating switch 90 controlled by PD interface 80 to PD operating circuitry 100. The input to PD operating circuitry 100 is connected to DC/DC converter 105 and appears across capacitor 110, also known as the input capacitor. In a preferred embodiment, first and second data transformers 50 are part of PD interface 80. The center tap of the primary of each of first and second data transformer 55, located within PD 70, is connected to PD interface 80. The secondary of first and second data transformers 55 are connected to communication devices, represented by first and second data pairs 25, respectively.

Variable current limiter 47 and electronically controlled switch 46 are illustrated as separate elements, however this is not meant to be limiting in any way. In an exemplary embodiment variable current limiter 47 and electronically controlled switch are implemented as a single FET and comparator circuit as described in U.S. Pat. No. 6,473,608 to Lehr et al incorporated by reference above.

In operation, control circuitry 42 of PSE 40 detects PD 70 via detection functionality 48, optionally classifies PD 70 via classification functionality 49, and if power is available, supplies power over seventh and eighth twisted pair connections 60, with data being supplied from switch/hub equipment 35 over first and second twisted pair connections 60 through midspan power insertion equipment 180 to fifth and sixth twisted pair connections 60. Power and data are thus supplied over separate connections, and are not supplied over a single twisted pair connection. The center tap connection of each of first and second data transformer 55 is not utilized, but is shown connected in order to allow operation alternatively as described above in relation to network configuration 10 of FIG. 1A. Network configurations 10, 150 and 170 thus allow for powering PD 70 by PSE 40 either over the set of two twisted pair connections 60 utilized for data communications, or over the set of two twisted pair connections 60 not utilized for data communications.

PD interface 80 functions to present a signature resistance (not shown) to PSE 40 thus enabling detection by detection functionality 48, optionally present a classification current in cooperation with classification functionality 49, and upon detection of a sufficient operating voltage, denoted as $V_{on}$, irrespective of polarity, to close isolating switch 90 thereby powering PD operating circuitry 100. DC/DC converter 105 is operable to convert the power received from PD interface 80 to an appropriate voltage to power PD operating circuitry 100 and exhibits capacitor 110 across its input. Thus, upon the closing of isolating switch 90, capacitor 110 is presented as an input capacitor to PSE 40 through diode bridges 85, and seventh and eighth twisted pair connections 60. PD interface 80 is further operable to monitor the voltage presented from PSE 40, and in the event that the monitored voltage is below a predetermined turn off voltage, denoted $V_{off}$, to open isolating switch 90. In an exemplary embodiment, $V_{on}$ is a maximum of 42 volts, and $V_{off}$ is a minimum of 30 volts.

Control circuitry 42 is further operable prior to closing electronically controlled switch to set variable current limiter 47 to a first value, denoted $I_{lim1}$, and to measure the port voltage via voltage measuring means 44 periodically during the start up phase while further marking the time of measurement in relation to the closing of electronically controlled switch 46. In a preferred embodiment a voltage measurement is taken every 2 μseconds after closing electronically controlled switch 46 until the end of the start up period, typically 30 milliseconds after closing electronically controlled switch 46. Preferably, voltage measurements begin after the end of a transient phase lasting up to 2 milliseconds. Control circuitry 42 is further operable to determine the minimum voltage point from among the periodic measurements, denoted $V_{min1}$, and to store $V_{min1}$ and associated time from closing electronically controlled switch 46, denoted $t_{min}$.

At a successive start up, i.e. after control circuitry 42 has shut down power to PD operating circuitry 100, control circuitry 42 is further operable prior to closing electronically controlled switch to set variable current limiter 47 to a second value, denoted $I_{lim2}$, different than the $I_{lim1}$, and to measure the port voltage via voltage measuring means 44 at the time $t_{min}$ from closing electronically controlled switch 46. Control circuitry 42 further calculates the cable impedance as the difference between the stored voltage measurement and the voltage measurement at the successive start up divided by the difference between the first value and the second value, in particular in accordance with Eq. 1, above. Thus, $t_{min}$ is utilized to ensure that $V_{min1}$ and $V_{min2}$ correspond in the time domain in relation to a startup.

The above has been described in an embodiment in which the cable impedance is determined at a second startup event, the second startup event occurring at a time in the future from the first startup event, however this is not meant to be limiting in any way. In one embodiment, PDs are initially powered, have power removed for a sufficient time to ensure discharge of capacitor 110, and are subsequently automatically powered after detection and optional classification, the second powering accomplishing determination of the cable impedance in accordance with Eq. 1.

In one embodiment $I_{lim1}$ and $I_{lim2}$ each meet the requirements for $I_{inrush}$, i.e. both $I_{lim1}$ and $I_{lim2}$ are between 400 mA and 450 mA.

Figure 2A:
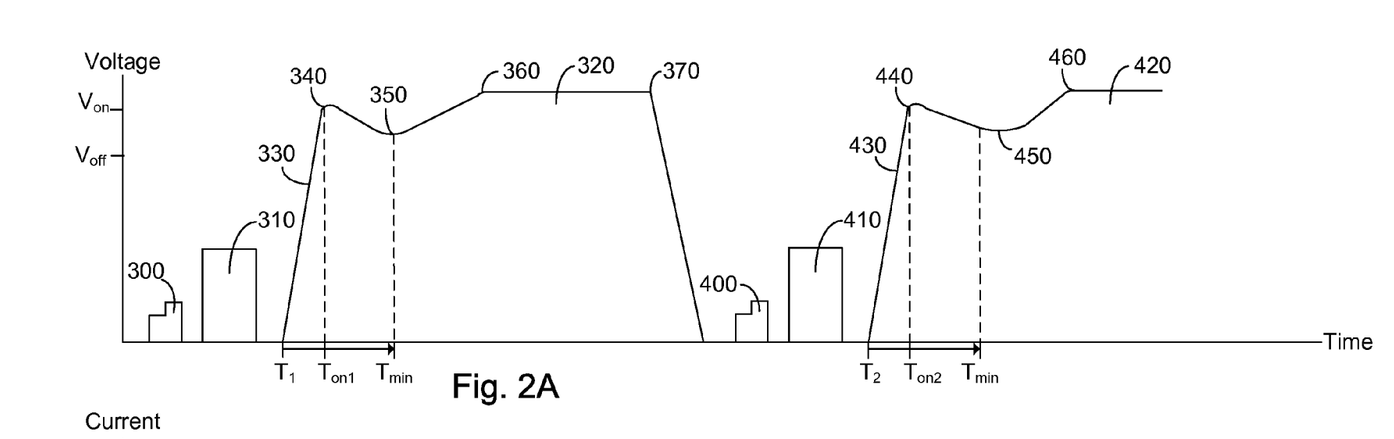
FIG. 2A illustrates a timing diagram of voltages, determined at the output of the PSE, including detection, classification and turn on voltages, according to a principle of the current invention.

FIG. 2A illustrates a timing diagram of PSE voltages, including detection, classification and turn on in accordance with a principle of the current invention, in which the x-axis represents time and the y-axis represents PSE output port voltage. A waveform 300, representative of detection of a PD 70 by a PSE 40 utilizing detection functionality 48, exhibits a plurality of voltage levels typically below 10 volts. A waveform 310, subsequent to waveform 300, represents optional classification of the identified PD 70 by PSE 40 utilizing classification functionality 49, and exhibits a classification voltage typically of 15.5-20.5 volts limited to 100 mA or less. Optional classification waveform 310 is preferably valid for 10-75 milliseconds.

Waveform 320, subsequent to optional classification waveform 310, representative of electronically controlled switch 46 being closed, beginning at a time denoted $T_1$, exhibits a rising leading edge 330 until voltage at PD 70 exhibits a value $V_{on}$, denoted point 340 at a time denote $T_{on1}$. The value of $V_{on}$ at PD 70 is illustrated as being equal to $V_{on}$ at the output of PSE 40; however this is not meant to be limiting in any way, and is illustrated solely for ease of explanation. Typically the voltage at PD 70 is lower than the voltage at the output of PSE 40 as a function of the impedance of the twisted wire pair connections 60 and associated connector losses. Waveform 320 represents powering by the closing of electronically controlled switch 46 with current limiter 47 set to a first current limit, denoted $I_{lim1}$.

PD 70, and in particular PD interface 80, responsive to $V_{on}$, closes isolating switch 90, thereby presenting PD operating circuitry 100, DC/DC converter 105 and particularly input capacitor 110 across the output of PSE 40. Voltage at the output of PSE 40 thus begins to decline, responsive to the near short circuit exhibited by input capacitor 100, and reaches a minimum voltage at point 350. Voltage at the output of PSE 40 is repeatedly measured, utilizing voltage measuring means 44, with an associated time of sampling from $T_1$. Preferably, voltage measurements begin after the end of a transient phase lasting up to 2 milliseconds. Minimum voltage point 350 occurs at a time denoted $T_{min}$, with $T_{min}$ being defined as the elapsed time from $T_1$. In a preferred embodiment, minimum voltage point 350 exhibits a voltage in excess of $V_{off}$ measured at PD 70. Voltage after minimum voltage point 350 begins to rise, reflecting charging of input capacitor 110, until a steady state operating voltage level 360 is reached.

Steady state operating voltage level 360 continues until power to PD 70 is interrupted by the opening of electronically controlled switch 46 by control circuitry 42 as illustrated at point 370. The voltage then declines to zero responsive to the lack of power being supplied to PD 70 over twisted wire pair connections 60.

After an appropriate delay, sufficient to allow input capacitor 110 to fully discharge, waveform 400, representative a subsequent of detection of PD 70 by a PSE 40 utilizing detection functionality 48, exhibits a plurality of voltage levels typically below 10 volts. Waveform 410, subsequent to waveform 400, represents optional classification of the identified PD 70 by PSE 40 utilizing classification functionality 49, and exhibits a classification voltage typically of 15.5-20.5 volts limited to 100 mA or less. Optional classification waveform 410 is preferably valid for 10-75 milliseconds.

Waveform 420, subsequent to optional classification waveform 410, representative of electronically controlled switch 46 being closed, beginning at a time denoted $T_2$, exhibits a rising leading edge 430 until voltage at PD 70 exhibits a value $V_{on}$, denoted point 440 at a time denote $T_{on2}$. Waveform 420 represents powering by the closing of electronically controlled switch 46 with current limiter 47 set to a second current limit, denoted $I_{lim2}$, with $I_{lim2}$ being different from $I_{lim1}$. The value of $V_{on}$ at PD 70 is illustrated as being equal to $V_{on}$ at the output of PSE 40; however this is not meant to be limiting in any way, and is illustrated solely for ease of explanation. Typically the voltage at PD 70 is lower than the voltage at the output of PSE 40 as a function of the impedance of the twisted wire pair connections 60 and associated connector losses.

PD 70, and in particular PD interface 80, responsive to $V_{on}$, closes isolating switch 90, thereby presenting PD operating circuitry 100, DC/DC converter 105 and particularly input capacitor 110 across the output of PSE 40. Voltage at the output of PSE 40 thus begins to decline, responsive to the near short circuit exhibited by input capacitor 100, and is sampled at time $T_{min}$, defined in relation to time $T_2$. Time $T_{min}$ may occur before or after a minimum voltage point 450, with the time differential being a function of the different current limits $I_{lim1}$, $I_{lim2}$. In a preferred embodiment, minimum voltage point 450 exhibits a voltage in excess of $V_{off}$ measured at PD 70. Voltage after minimum voltage point 450 begins to rise, reflecting charging of input capacitor 110, until a steady state operating voltage level 460 is reached. $T_{min}$ is preferably found within a predetermined time period defined to ensure that $T_{min}$ is prior to steady state operating voltage level 460, i.e. within the start up phase.

Thus, the waveforms of FIG. 2A represent two start ups of PD 70 at different current limits $I_{lim1}$, $I_{lim2}$, and exhibit different PSE 40 output voltages as a function of time responsive to the different current limits.

Figure 2B:
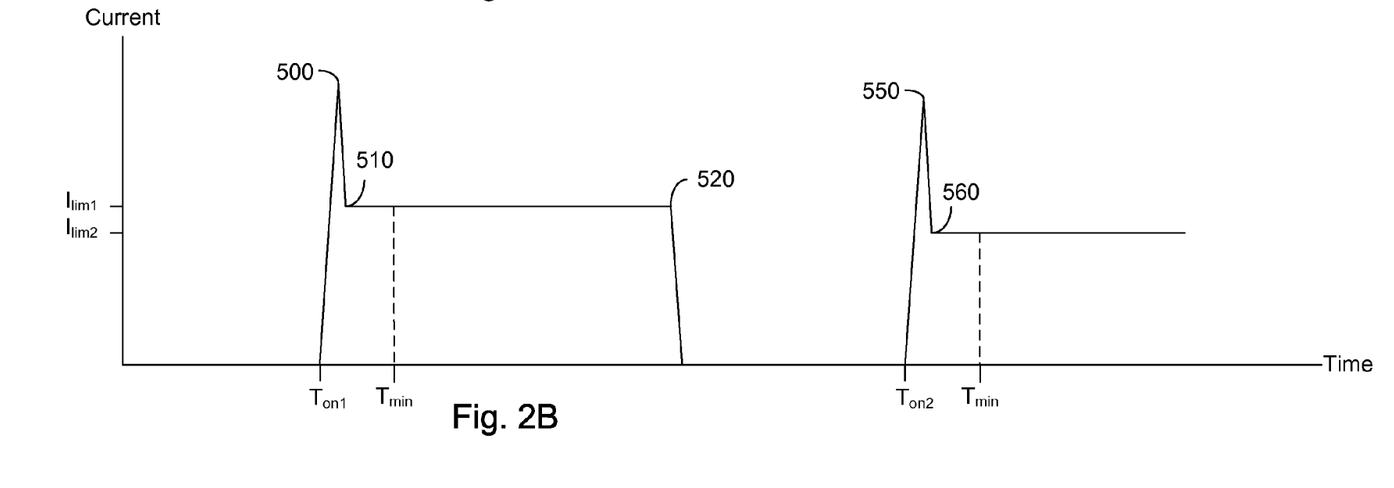
FIG. 2B illustrates a timing diagram of current drawn from the PSE corresponding to the voltages of FIG. 2A, according to a principle of the current invention.

FIG. 2B illustrates a timing diagram of current drawn from PSE 40 corresponding to the voltages of FIG. 2A, according to a principle of the current invention. Classification current, responsive to optional classification waveforms 310, 410 are not shown for clarity, in particular as the optional classification currents are typically less than 10% of the operating current values.

At point $T_{on1}$, which as described above in relation to FIG. 2A is coincident with the voltage at PD 70 exceeding $V_{on}$, PD interface 80, responsive to $V_{on}$, closes isolating switch 90, thereby presenting PD operating circuitry 100, DC/DC converter 105 and particularly input capacitor 110 across the output of PSE 40 and current flow begins to rise rapidly to charge input capacitor 110. Current, limited by current limiter 47 to $I_{lim1}$, peaks at a maximum point 500, within the transient phase period of up to 2 milliseconds. Current after maximum point 500 declines rapidly until a steady state current is achieved at point 510, limited by the value of current limiter 47 to $I_{lim1}$. Current remains at limit value $I_{lim1}$ at least until input capacitor 110 has mostly charged up, typically for at least 30 milliseconds. At point 520, responsive to the voltage at PD 70 declining below $V_{off}$, current flow drops off to zero.

At point $T_{on2}$, which as described above in relation to FIG. 2A is coincident with the voltage at PD 70 exceeding $V_{on}$, PD interface 80, responsive to $V_{on}$, closes isolating switch 90, thereby presenting PD operating circuitry 100, DC/DC converter 105 and particularly input capacitor 110 across the output of PSE 40 and current flow begins to rise rapidly to charge input capacitor 110. Current, limited by current limiter 47 to $I_{lim2}$, peaks at a maximum point 550 within the transient phase period of up to 2 milliseconds. Current after maximum point 550 declines rapidly until a steady state current is achieved at point 560, limited by the value of current limiter 47 to $I_{lim2}$. Current remains at limit value $I_{lim2}$ at least until input capacitor 110 has mostly charged up, typically for at least 30 milliseconds.

Thus, the waveforms of FIG. 2B represent two start ups of PD 70 at different current limits $I_{lim1}$, $I_{lim2}$, and exhibit different values during the start up phase of PD 70, representative of the charging of input capacitor 110 limited by the different current limit settings of current limiter 47, namely $I_{lim1}$, $I_{lim2}$.

Figure 3:
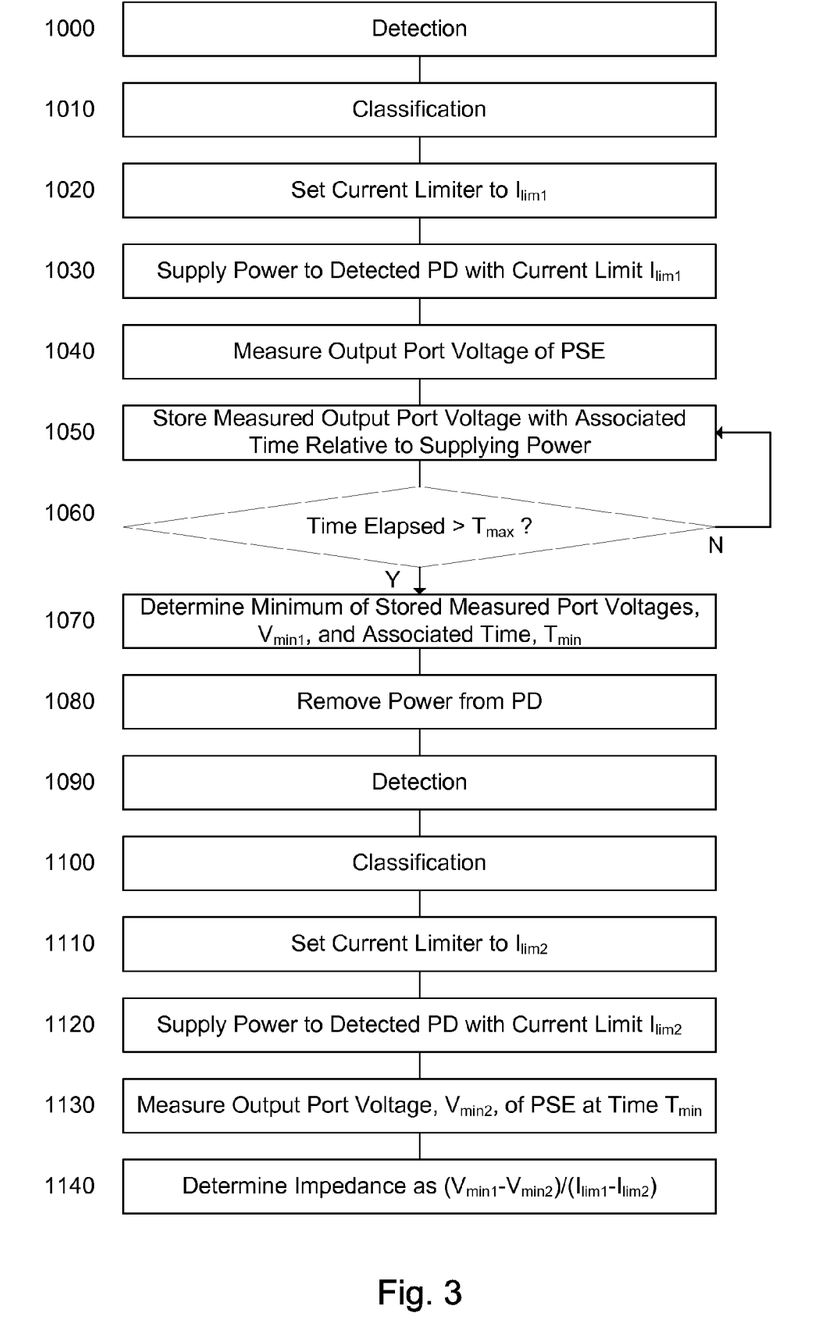
FIG. 3 illustrates a high level flow chart of the operation of the PSE of any of FIGS. 1A-1C to determine the impedance between the PSE and the PD according to a principle of the current invention.

FIG. 3 illustrates a high level flow chart of the operation of the PSE of any of FIGS. 1A-1C to determine the impedance between PSE 40 and PD 70 according to a principle of the current invention. In stage 1000, PSE 40, utilizing detection functionality 48, detects PD 70. In the event PD 70 is not detected, a back off period is initiated, and stage 1000 is again performed. In the event that PD 70 is detected, in optional stage 1010, PSE 40, utilizing classification functionality 49, classifies the detected PD 70 to determine the maximum power draw requested by detected PD 70. Preferably, PSE 40 powers PD 70 only in the event that sufficient power is available to meet the maximum power draw request of detected PD 70 in accordance with the classification. As described above, the power to be allocated by PSE 40 is a function of the maximum power draw of PD 70 and the power loss associated with the impedance between PSE 40 and PD 70. Until the impedance between PSE 40 and PD 70 has been determined, a worst case scenario, as defined in above mentioned IEEE 802.3af-2003 standard is preferably utilized.

In stage 1020, current limiter 47 is set to a first current limit, $I_{lim1}$. Preferably, $I_{lim1}$ represents sufficient current to start up DC/DC converter 105 thereby powering PD operating circuitry 100. In stage 1030, electronically controlled switch 46 is closed, thereby supplying power to detected PD 70 of stage 1000, with current limit $I_{lim1}$ of stage 1020. Closing of electronically controlled switch 46 occurs at a time denoted $T_1$. In stage 1040, the output port voltage of PSE 40 is measured via voltage measuring means 44. Preferably, voltage measurements begin after the end of a transient phase lasting up to 2 milliseconds from time $T_1$. In stage 1050, the measured port voltage is stored associated with the time elapsed since time $T_1$, i.e. the time relative to the beginning of supplying power.

In stage 1060, the time is compared with a predetermined maximum time, denoted $T_{max}$. $T_{max}$ is selected to ensure that the measured and stored voltages are representative of the start up phase of PD 70 and not the operating phase. In one embodiment $T_{max}$ is up to 30 milliseconds, representing the end of the start up phase. In the event that the time elapsed is not greater than $T_{max}$, stage 1050 is again performed. In a preferred embodiment, stage 1050 is thus performed repeatedly, without undue wait states, until the time elapsed exceeds $T_{max}$. In one embodiment stage 1050 is performed every 2 μseconds after the end of the transient phase until $T_{max}$.

In the event that in stage 1060 the time elapsed is greater than $T_{max}$, in stage 1070 the stored measured port voltages of stage 1050 are examined and the minimum port voltage, $V_{min1}$, and the associated time, $T_{min}$, are determined.

In stage 1080, power is removed from PD 70, by opening electronically controlled switch 46. In one embodiment stage 1080 is performed after a steady state operating condition has been achieved by PD 70. In another embodiment stage 1080 is performed immediately after $T_{max}$. Preferably stage 1080 further comprises a wait state sufficient to ensure complete discharge of input capacitor 110.

In stage 1090, PSE 40, utilizing detection functionality 48, again detects PD 70. In optional stage 1100, PSE 40, utilizing classification functionality 49, classifies the detected PD 70 to determine the maximum power draw by detected PD 70. In stage 1110, current limiter 47 is set to a second current limit, $I_{lim2}$. Preferably, $I_{lim2}$ represents sufficient current to start up DC/DC converter 105 thereby powering PD operating circuitry 100, and is sufficiently different from $I_{lim1}$ to enable determination of the impedance in accordance with stage 1140 described below.

In stage 1120, electronically controlled switch 46 is closed, thereby supplying power to detected PD 70 of stage 1090, with current limit $I_{lim2}$ of stage 1110. Closing of electronically controlled switch 46 occurs at a time denoted $T_2$. In stage 1130, the output port voltage of PSE 40, $V_{min2}$, is measured via voltage measuring means 44 at time $T_{min}$ in relation to time $T_2$. Thus, the time associated with the minimum voltage point of stage 1070, obtained during the first start up with current limit $I_{lim1}$, is utilized to measure the port voltage during the second start up with current limit $I_{lim2}$. In stage 1140, the impedance between PSE 40 and PD 70, denoted $Z_{cable}$, is determined responsive to the measured voltages, $V_{min1}$, $V_{min2}$ and the current limits $I_{lim1}$, $I_{lim2}$. In particular, $Z_{cable}$ is calculated in accordance with Eq. 1 described above.

Thus, the method of FIG. 3 determines the impedance, $Z_{cable}$, between PSE 40 and PD 70 responsive to a first start up at a first current limit, and a second start up at a second current limit, different than the first current limit. The voltage difference at a particular point in time, preferably in reference to closing electronically controlled switch 46, is further utilized.

Figure 4:
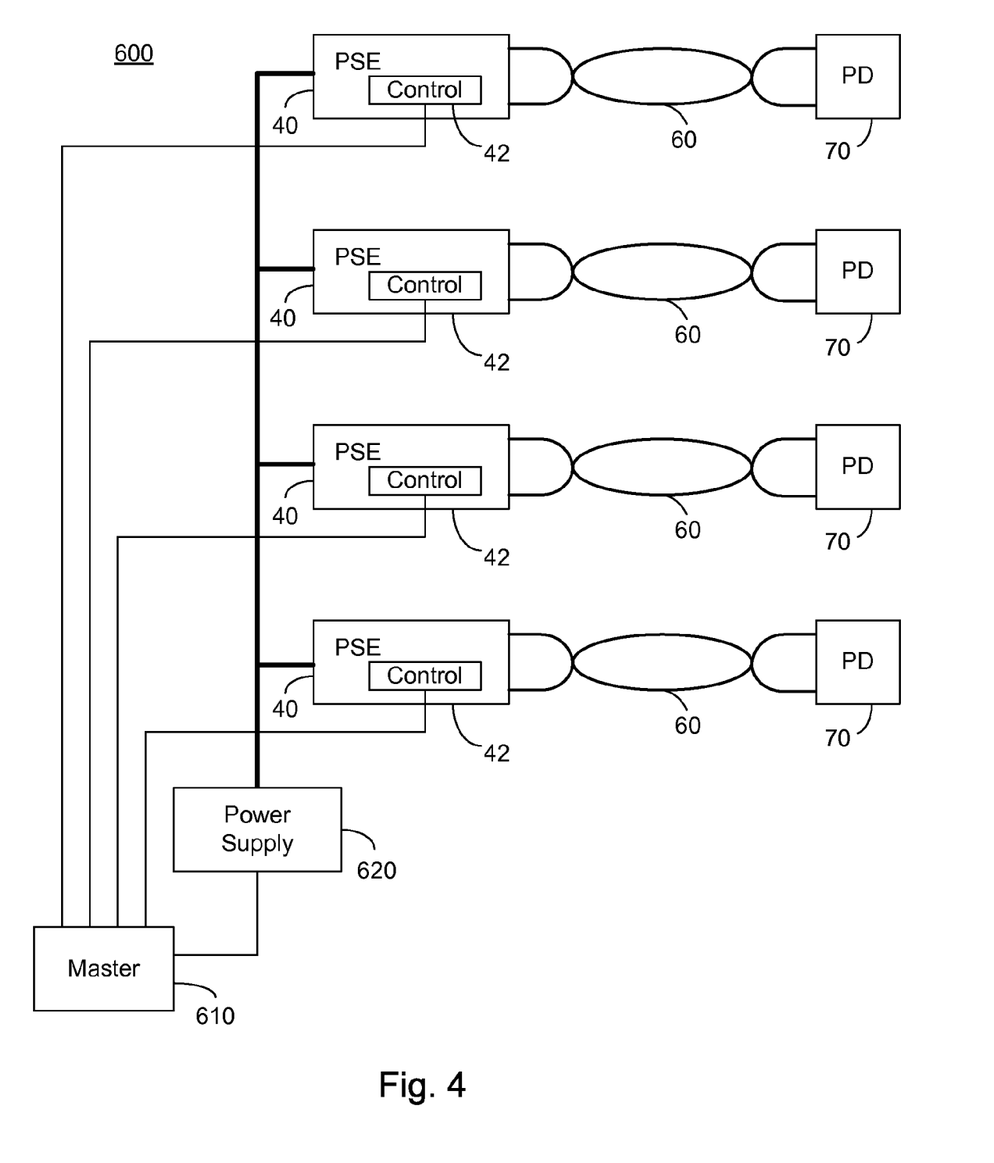
FIG. 4 illustrates a high level block diagram of a plurality of PSEs receiving power from a common source and arranged to power a plurality of PDs, the PSEs being responsive to a master controller, according to a principle of the current invention.

FIG. 4 illustrates a high level block diagram of a system 600 comprising a plurality of PSEs 40, responsive to a master controller 610, receiving power from a common power supply 620 and arranged to power a plurality of PDs 70 each over a respective communication cabling 60 according to a principle of the current invention. Each PSE 40 comprises a control circuitry 42 in communication with master controller 610.

In operation, master controller 610 of system 600 determines a total amount of power from common power supply 620. Preferably, master controller 610 further determines the output voltage of common power supply 620. Master controller 610 further receives from each control circuitry 42 a classification of the attached PD 70 and a determination of the impedance of the associated communication cabling 60, $Z_{cable}$, connecting the PSE 40 and PD 70. Master controller 610 calculates the actual maximum power draw from common power supply 620 for each PD 70 responsive to the classification of PD 70, the determined impedance, $Z_{cable}$ of the associated communication cabling 60 and preferably the output voltage of common power supply 620. In the event that sufficient power is available from common power supply 620, an additional PD 70 is powered responsive to detection. In the event that sufficient power is not available from common power supply 620, an additional PD 70 is not powered.

Impedance between each PSE 40 and PSE 70, $Z_{cable}$, is determined in accordance with the method of FIG. 3, and in a preferred embodiment is calculated during the first two start ups of a port. The determined impedance is then utilized for all subsequent powering decisions of subsequent ports. In another embodiment, impedance $Z_{cable}$ is determined whenever a PD 70 is first detected, and thus powering and disabling is accomplished to determine the impedance, and the actual power draw is ensured available prior to a subsequent powering.

The above has been described in relation to a plurality of PDs 70 exhibiting classification, however this is not meant to be limiting in any way. In the event that one or more PD 70 does not exhibit a classification, a default classification value is utilized. The above has been described in relation to a plurality of PSEs 40 each exhibiting classification functionality 49, however this is not meant to be limiting in any way. In the event that one or more PSEs 40 do not exhibit a classification functionality 49, a default classification value is utilized.

Figure 5:
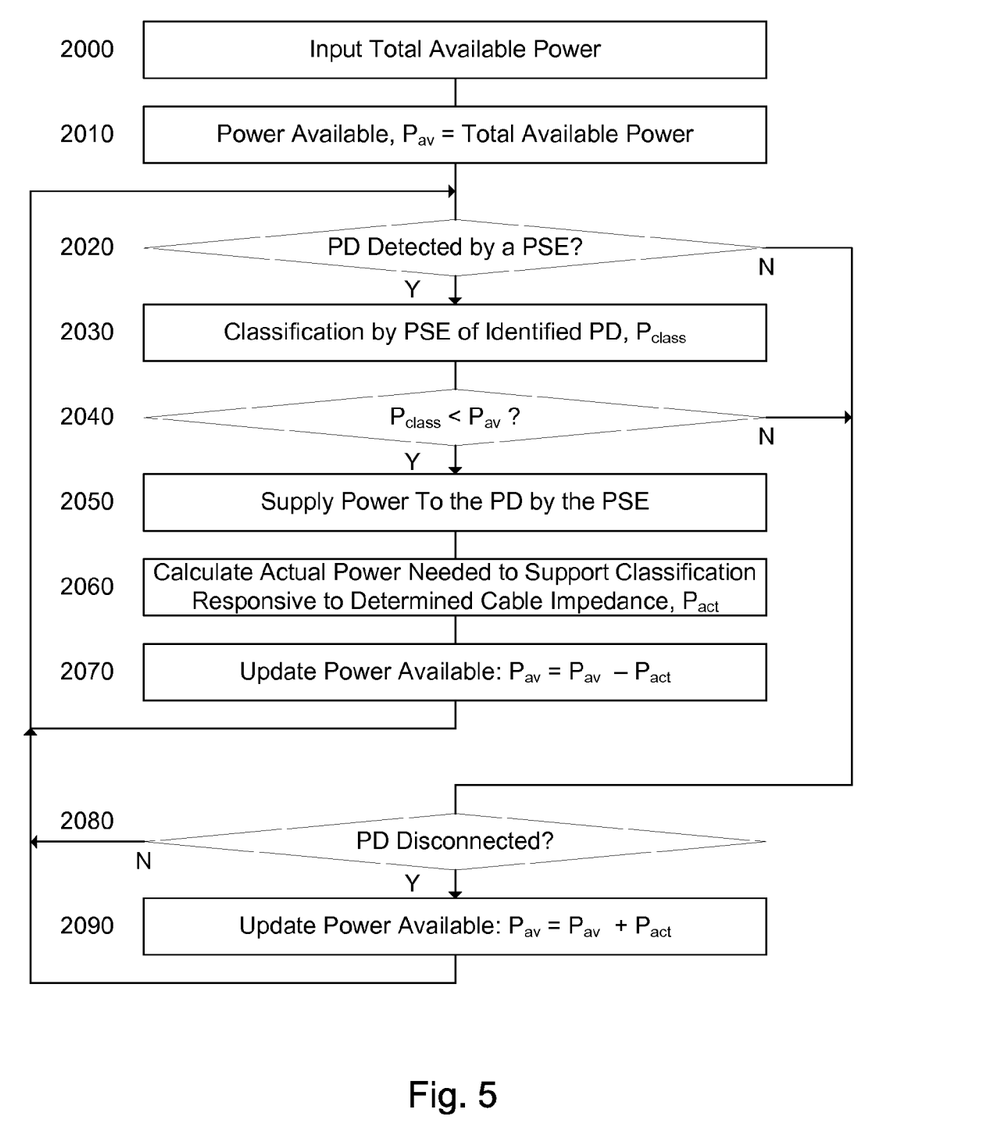
FIG. 5 illustrates a high level flow chart of the operation of the master controller of FIG. 4 to allocate power responsive to the determined impedance of FIG. 3 according to a principle of the current invention.

FIG. 5 illustrates a high level flow chart of the operation of the master controller of system 600 of FIG. 4 to allocate power responsive to the determined impedance, $Z_{cable}$, of FIG. 3 according to a principle of the current invention. In stage 2000, the total power available from common power supply 620 is input. Preferably the voltage output if further input. In one embodiment master controller 610 is in communication with common power supply 620, and in another embodiment the total available power is input from one of a host and a user.

In stage 2010, a variable denoted $P_{av}$ is established, and $P_{av}$ is further set to be equal to the total available power input in stage 2000. In stage 2020, PSEs 40 in communication with master controller 610 are polled to determine if any of the PSEs 40 have detected a valid PD 70.

In the event that a valid PD 70 has been detected by a PSE 40, in stage 2030, the detected PD 70 is classified to determined maximum power draw. In an embodiment in which no classification is performed, a default classification of the maximum power draw is assigned. The maximum power draw is denoted $P_{class}$.

In stage 2040, the power needed to support the classification of stage 2030, in a worst case scenario, $P_{class}$, is compared with $P_{av}$, representing the power available. In the event that Pclass is less than Pav, i.e. the power needed is less than the power available, in stage 2050 power is supplied by the associated PSE 40 to the PD 70 identified and classified in stages 2020, 2030 above.

In stage 2060, the actual power, denote Pact, needed to support the classification of stage 2030 responsive to the determined impedance between PSE 40 and PD 70 in accordance with the method of FIG. 3 above, is calculated. In stage 2070 the available power variable, $P_{av}$, is updated responsive to the power calculated in stage 2060 as: $P_{av}=P_{av}-P_{act}$. Thus, in stage 2070 the available power is reduced by the actual power required to support the classification of stage 2030 responsive to the determined impedance between PSE 40 and PD 70. Stage 2020 as described above is then performed.

In the event that in stage 2020 a valid PD 70 has not been detected by a PSE 40, or in the event that in stage 2050 $P_{class}$ is not less than $P_{av}$, i.e. the power needed is more than or equal to the available power, in stage 2080 control circuitry 42 of each PSE 40 is polled to determine if any PD 70 for which power has been allocated has been disconnected. In particular, the term disconnected is meant to include any situation in which power to the port is not to be maintained including a condition in which the port has become locally powered. In accordance with the above mentioned standard, a valid PD 70 must present one of a DC maintain power signature and an AC maintain power signature in order to power to be maintained.

In the event that in stage 2080 a port has been disconnected, in stage 2090 the power available is updated to reflect the power, $P_{act}$, no longer allocated to the disconnected port as: $P_{av}=P_{av}+P_{act}$. Stage 2020 as described above is then performed. In the event that in stage 2080 a port has not been detected as disconnected, stage 2020 as described above is then performed.

The above has been described in an embodiment in which detection and disconnected are polled by master controller 610; however this is not meant to be limiting in any way. In another embodiment, master controller 610 acts responsive to interrupts from each PSE 40 indicating detection and/or disconnection.

The method of FIG. 5 provides powering responsive to the determined cable impedance. Advantageously, the actual maximum power to support classification is calculated and allocated, thus preventing wasted power, and enabling powering of additional detected PDs 70.

Thus the present embodiments enable a method of, and an apparatus for, determining the impedance between the PSE and the PD, the method involving a first start-up of the PD and a second start-up of the PD. Power is provided during the first start-up of the PD, the power being current limited to a first current value. A plurality of voltage measurements at the output of the PSE are accomplished during the start-up phase of the PD, and a minimum voltage measurement, with the associated time from start-up of the minimum voltage measurement is determined. During the second start-up of the PD, power is provided with current limited to a second current value different form the first current value. A voltage measurement at the output of the PSE corresponding in time to the minimum measurement of the first start up is accomplished. The cable impedance is determined as the difference between the voltage measurements divided by the difference between the current values.

Advantageously, determining the actual impedance of the cable and connections between the PSE and the PD allows for better allocation of power, since the actual power required to be allocated to the PSE in order to supply the PD classification power is more accurately determined.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination. In particular, the invention has been described with an identification of each powered device by a class, however this is not meant to be limiting in any way. In an alternative embodiment, all powered device are treated equally, and thus the identification of class with its associated power requirements is not required.

Thus the present embodiment enable an architecture for simultaneous power feeding from multiple sources over two sets of wire pairs, with classification of power requirements, particularly high power requirements, being a value encoded in the individual classification obtained over each of the sets of wire pairs.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description.

I claim:

1. A method of determining impedance between a power sourcing equipment and a powered device, the method comprising:

supplying power to the powered device from the power sourcing equipment over a communication cabling at a first current limited level, $I_{lim1}$;

measuring, at a plurality of times in relation to the beginning of said supplying power, a voltage associated with the output of the power sourcing equipment;

determining a minimum voltage, $V_{min1}$, of said measured plurality of voltages;

determining an associated time, $t_{min}$, of said determined $V_{min1}$ in relation to said beginning of said supplying power at said $I_{lim1}$;

removing, subsequent to said supplying power at said $I_{lim1}$, said supplied power from the powered device;

subsequent to said removing, supplying power to the powered device from the power sourcing equipment over the communication cabling at a second current limited level, $I_{lim2}$, said $I_{lim2}$ being different than said $I_{lim1}$;

measuring, at said determined associated time $t_{min}$ in relation to the beginning of said supplying power at said $I_{lim2}$, a voltage associated with the output of the power sourcing equipment, $V_{min2}$; and determining an impedance responsive to said $V_{min1}$, $V_{min2}$, $I_{lim1}$ and $I_{lim2}$.

2. A method according to claim 1, wherein said determining an impedance comprises:

calculating the impedance as the result of $(V_{min1}-V_{min2})/(I_{lim1}-I_{lim2})$.

3. A method according to claim 1, further comprising: providing a variable current limiter operative to provide said $I_{lim1}$ and said $I_{lim2}$.

4. A method according to claim 1, further comprising detecting a powered device over the communication cabling, said detecting being prior to said supplying power to the powered device at said $I_{lim1}$.

5. A method according to claim 1, further comprising classifying the detected powered device over the communication cabling, said classifying being prior to said supplying power to the powered device at said $I_{lim1}$.

6. A method according to claim 1, further comprising allocating power to said powered device responsive to said determined impedance.

7. A method according to claim 1, further comprising allocating power to said powered device, said allocating power being a function of a power requested by said powered device less power lost in the communication cabling, said power lost in the communication cabling being calculated responsive to said determined impedance.

8. A method according to claim 7, further comprising classifying the detected powered device over the communication cabling, wherein said power requested is a function of said classifying.

9. A method according to claim 1, wherein, said plurality of times are within a predetermined time from the beginning of said supplying power at said $I_{lim1}$.

10. A method according to claim 1, wherein said measuring at a plurality of times begins after a transient phase period.

11. A power sourcing equipment operative to determine an impedance between the power sourcing equipment and a powered device, the power sourcing equipment comprising:

a voltage measuring means;

a control circuitry responsive to said voltage measuring means; and at least one current limiter responsive to said control circuitry, said control circuitry operative to:

supply power to a powered device over a communication cabling at a first current limited level, $I_{lim1}$, said $I_{lim1}$ being responsive to said at least one current limiter;

measure, via said voltage measuring means, at a plurality of times in relation to the beginning of said power being supplied at said $I_{lim1}$, a voltage associated with the output of the power sourcing equipment;

determine a minimum voltage, $V_{min1}$, of said measured plurality of voltages;

determine an associated time, $t_{min}$, of said determined $V_{min1}$ in relation to said beginning of said power being supplied at said $I_{lim1}$;

remove, subsequent to said power being supplied at said $I_{lim1}$, said supplied power from the powered device;

subsequent to said removal of power, supply power to the powered device over the communication cabling at a second current limited level, $I_{lim2}$, said $I_{lim2}$ being different than said $I_{lim1}$, said $I_{lim2}$ being responsive to said at least one current limiter;

measure, via said voltage measuring means, at said determined associated time $t_{min}$ in relation to the beginning of said power being supplied at said $I_{lim2}$, a voltage associated with the output of the power sourcing equipment, $V_{min2}$; and determine an impedance responsive to said $V_{min1}$, $V_{min2}$, $I_{lim1}$ and $I_{lim2}$.

12. A power sourcing equipment according to claim 11, wherein said impedance is determined by said control circuitry operative to calculate the impedance as the result of $(V_{min1}-V_{min2})/(I_{lim1}-I_{lim2})$.

13. A power sourcing equipment according to claim 11, wherein said at least one current limiter comprises a variable current limiter operative to provide said $I_{lim1}$ and said $I_{lim2}$.

14. A power sourcing equipment according to claim 11, further comprising a detection functionality responsive to said control circuitry, said detection functionality being operative to detect the powered device prior to said power being supplied to the powered device at said $I_{lim1}$.

15. A power sourcing equipment according to claim 11, further comprising a classification functionality responsive to said control circuitry, said classification functionality being operative to classify the powered device according to power demand.

16. A power sourcing equipment according to claim 11, wherein said control circuitry is further operative to allocate power to said powered device responsive to said determined impedance.

17. A power sourcing equipment according to claim 11, wherein said control circuitry is further operative to allocate power to said powered device, said allocation of power being a function of a power requested by said powered device less power lost in the communication cabling, said power lost in the communication cabling being calculated responsive to said determined impedance.

18. A power sourcing equipment according to claim 17, further comprising a classifying functionality operative to classify the powered device according to power demand, wherein said power requested is a function of said classification.

19. A power sourcing equipment according to claim 11, wherein, said plurality of times are within a predetermined time period from the beginning of said power being supplied at said $I_{lim1}$.

20. A power sourcing equipment according to claim 11, wherein said measuring at a plurality of times begins after a transient phase period.

* * * * *